United States Patent
Liukku et al.

(10) Patent No.: US 9,969,606 B2
(45) Date of Patent: May 15, 2018

(54) MICROELECTROMECHANICAL STRUCTURE AND DEVICE

(71) Applicant: MURATA MANUFACTURING CO., LTD., Nagaokakyo-shi, Kyoto (JP)

(72) Inventors: Matti Liukku, Helsinki (FI); Jaakko Ruohio, Helsinki (FI); Hannu Vesterinen, Espoo (FI)

(73) Assignee: MURATA MANUFACTURING CO., LTD., Nagaokakyo-Shi, Kyoto (JP)

( * ) Notice: Subject to any disclaimer, the term of this patent is extended or adjusted under 35 U.S.C. 154(b) by 0 days. days.

(21) Appl. No.: 15/064,879

(22) Filed: Mar. 9, 2016

(65) Prior Publication Data

US 2016/0264401 A1   Sep. 15, 2016

(30) Foreign Application Priority Data

Mar. 9, 2015  (FI) ..................................... 20155153

(51) Int. Cl.
*B81B 3/00* (2006.01)
*G01P 15/125* (2006.01)
(Continued)

(52) U.S. Cl.
CPC .......... *B81B 3/0045* (2013.01); *B81B 3/0086* (2013.01); *G01P 15/125* (2013.01);
(Continued)

(58) Field of Classification Search
CPC .............................. B81B 3/0045; B81B 3/086
See application file for complete search history.

(56) References Cited

U.S. PATENT DOCUMENTS

2004/0231420 A1   11/2004   Xie et al.
2008/0297974 A1   12/2008   Skog et al.
(Continued)

FOREIGN PATENT DOCUMENTS

EP   1 857 821 A2   11/2007
EP   2 023 151       2/2009
(Continued)

OTHER PUBLICATIONS

International Search Report application No. PCT/IB2016/051265 dated Jun. 6, 2016.
(Continued)

*Primary Examiner* — Seahvosh Nikmanesh
(74) *Attorney, Agent, or Firm* — Squire Patton Boggs (US) LLP

(57) ABSTRACT

A MEMS structure that provides an improved way to selectively control electromechanical properties of a MEMS device with an applied voltage. The MEMS structure includes a capacitor element that comprises at least one stator element, and at least one rotor element suspended for motion parallel to a first direction in relation to the stator element. The stator element and the rotor element form at least one capacitor element, the capacitance of which varies according to displacement of the rotor element from an initial position. The stator element and the rotor element are mutually oriented such that in at least one range of displacements of the rotor element from an initial position, the second derivative of the capacitance with respect to the displacement has negative values.

22 Claims, 12 Drawing Sheets

(51) Int. Cl.
  *H01G 5/14* (2006.01)
  *G01P 15/08* (2006.01)
(52) U.S. Cl.
  CPC ........ *H01G 5/14* (2013.01); *B81B 2201/0221* (2013.01); *G01P 2015/0814* (2013.01)

(56) References Cited

U.S. PATENT DOCUMENTS

| | | | |
|---|---|---|---|
| 2010/0019617 A1* | 1/2010 | Murari | H02N 1/006 310/300 |
| 2011/0018561 A1 | 1/2011 | Hartwell et al. | |
| 2011/0303010 A1 | 12/2011 | Yang | |
| 2012/0048019 A1 | 3/2012 | Zhou et al. | |
| 2013/0147313 A1 | 6/2013 | Sachse | |
| 2013/0229747 A1 | 9/2013 | Finnigan | |

FOREIGN PATENT DOCUMENTS

| | | |
|---|---|---|
| WO | WO 2013/188131 A1 | 12/2013 |
| WO | 2014/207710 A1 | 12/2014 |

OTHER PUBLICATIONS

Finnish Search Report dated Nov. 17, 2015 corresponding to Finnish Patent Application No. 20155153.

* cited by examiner

MICROELECTROMECHANICAL STRUCTURE AND DEVICE

BACKGROUND

Field

The invention relates to a microelectromechanical structure with a stator, and a rotor suspended for motion parallel to a first direction in relation to the stator.

Description of the Related Art

Micro-Electro-Mechanical Systems (MEMS) are miniaturized electro-mechanical systems that can be applied to quickly and accurately sense very small changes in physical properties. In many MEMS devices, sensing is based on detecting variations in capacitance.

In a parallel plate capacitor, capacitance is proportional to the area of overlap and inversely proportional to the separation between two capacitor plates. Parallel plate capacitors can be used to create closing gap structures, or area modulated structures.

FIG. 1A shows a configuration illustrating a parallel plate capacitor. In closing gap structures, capacitor plates move towards and away from each other in a direction denoted with x. Typically one of the plates is stationary, and the other plate moves closer to and further away from the other plate. The capacitance behavior can then be approximately modeled with equation (1)

$$C = \epsilon \frac{A}{d-x} + C_f \quad (1)$$

where C is the capacitance, $\epsilon$ is permittivity, A a constant overlap area between the plates, d an initial gap between the plates, x a displacement from the initial gap position, and $C_f$ a static stray capacitance.

FIG. 1B shows a configuration illustrating an area modulated structure, also known as a linear comb structure. In area modulated structures, the plates move parallel to each other and capacitance behavior can be modeled with equation (2)

$$C = \epsilon \frac{h(l+x)}{d} + C_f \quad (2)$$

where d is a constant gap between the plates, h a constant overlap dimension (height) of the plates, l an initial overlap length, x a displacement from the initial overlap length, and $C_f$ a static stray capacitance.

The resonance frequency f of a harmonic oscillator is proportional to the electric spring constant. The relation can be written as $$f = 1/(2\pi)\sqrt{((k_m + k_e)/m)} \quad (6)$$

where $k_m$ is a mechanical spring constant, $k_e$ an electric spring constant, and m mass. By controlling the electric spring constant it is possible to tune the resonance frequency of the harmonic oscillator.

The potential energy E in a MEMS capacitor can be written as $$E = \tfrac{1}{2}k_m x^2 - \tfrac{1}{2}CV^2, \quad (3)$$

wherein $k_m$ is the mechanical spring constant, x is a displacement from the initial capacitor structure, C is capacitance and V is voltage applied over the capacitor.

If the voltage over the capacitor is kept constant, the electric force $F_e$ acting on the capacitor is obtained by $$F_e = -\partial E/\partial x = \tfrac{1}{2}V^2 \partial C/\partial x. \quad (4)$$

An electric spring constant $k_e$ can then be obtained from $$k_e = -\partial F_e/\partial x = -\tfrac{1}{2}V^2 \partial C^2/\partial x^2 \quad (5)$$

The sign of the electric spring constant $k_e$ is thus dependent on the second derivative term $\partial C^2/\partial x^2$. The curves in FIG. 2 illustrate variation of exemplary capacitances in the closing gap and linear comb structures of FIGS. 1A and 1B as a function of displacement from the initial position. The curves in FIG. 3 illustrate the corresponding behavior of the second derivative of these capacitances. It is seen that in commonly used prior art resonating structures, the second derivative is always positive (when parallel plate electrodes are used) or zero (in linear comb drive structures). However, for many applications further control to the electromechanical behavior of MEMS structures would be very valuable.

SUMMARY

Embodiments of the present invention include a MEMS structure that provides an improved way to selectively control electromechanical properties of a MEMS device by an applied voltage.

The MEMS structure in the embodiments includes a capacitor element that comprises at least one stator element, and at least one rotor element suspended for motion parallel to a first direction in relation to the stator element. The stator element and the rotor element form the at least one capacitor element, wherein electrodes of the capacitor element are separated by a distance in a second direction that is perpendicular to the first direction, and the capacitance of the capacitor element is arranged to vary according to displacement of the rotor element from an initial position parallel to the first direction. The stator element and the rotor element are mutually oriented such that in at least one range of displacements of the rotor element from an initial position parallel to the first direction, the second derivative of the capacitance with respect to the displacement has negative values.

Some embodiments are presented in the following by means of figures to which the invention is, however, not restricted.

DETAILED DESCRIPTION

Figure 1A:
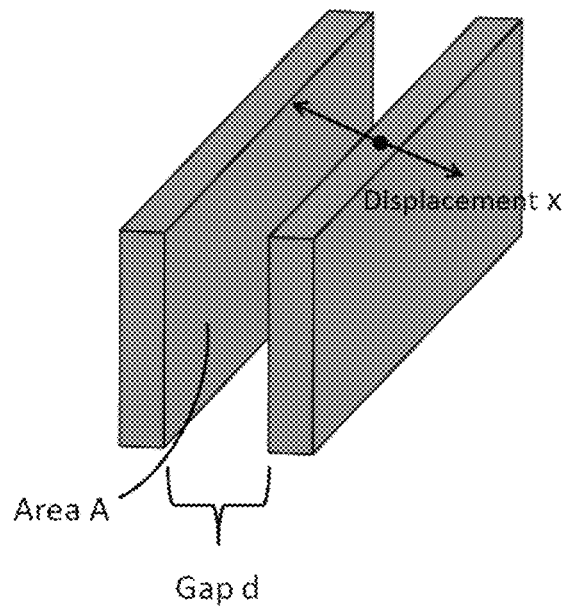
FIG. 1A shows a configuration illustrating a parallel plate capacitor.
Figure 1B:
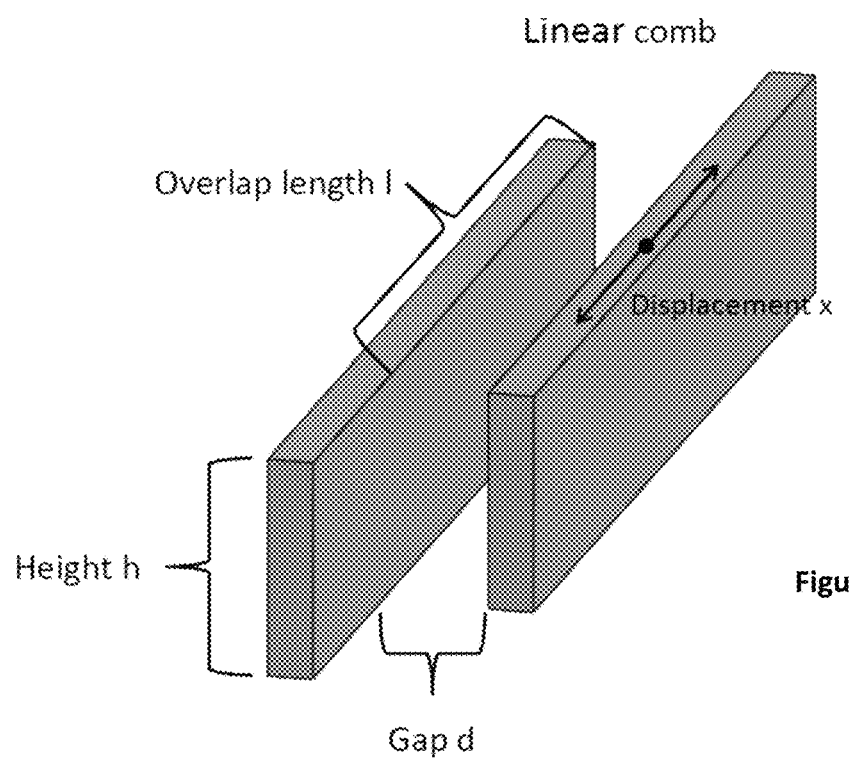
FIG. 1B shows a configuration illustrating a linear comb structure.
Figure 2:
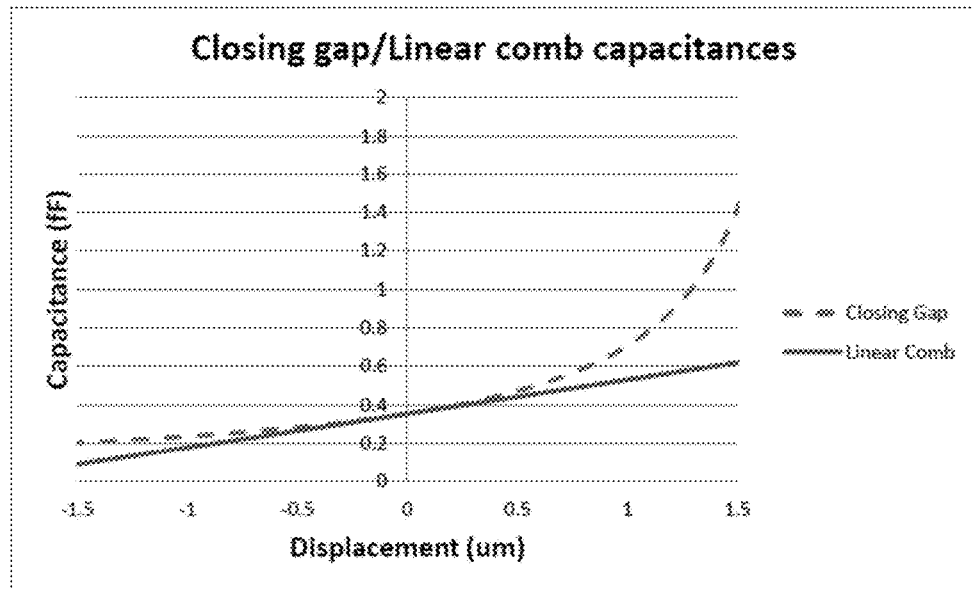
FIG. 2 illustrates variation of exemplary capacitances in the closing gap and linear comb structures of FIGS. 1A and 1B.
Figure 3:
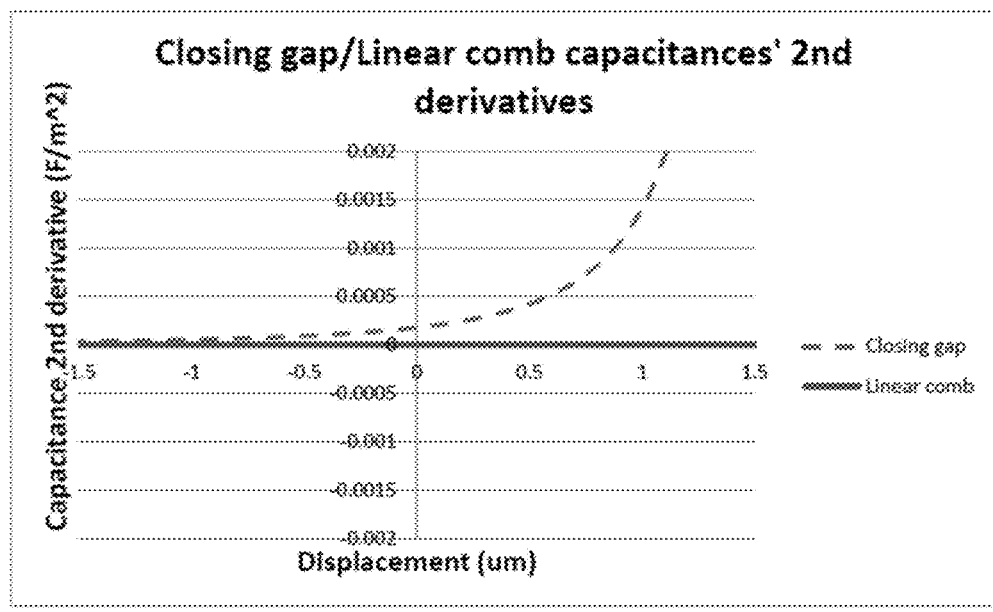
FIG. 3 illustrate behavior of the second derivative of the capacitances in FIG. 2.
Figure 4:
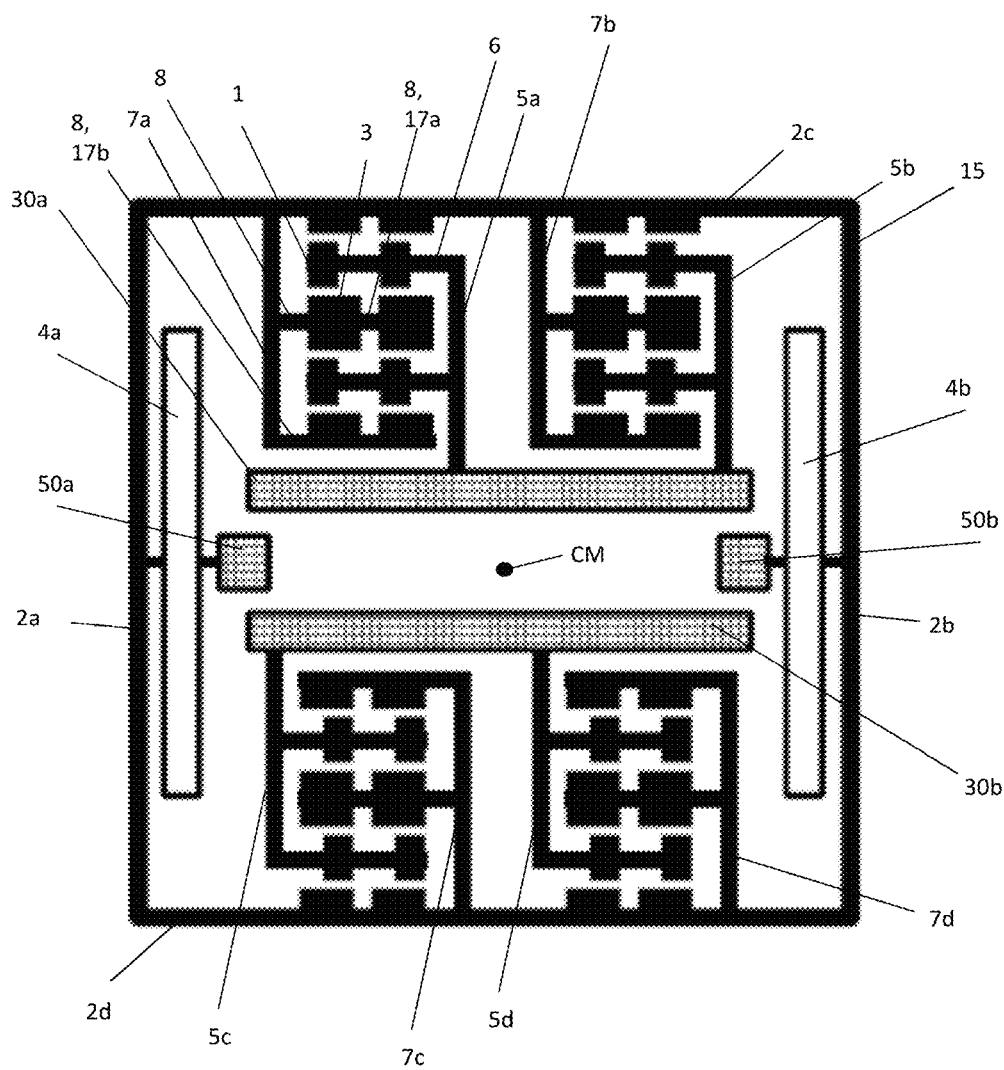
FIG. 4 illustrates an exemplary MEMS structure with a novel stator and rotor structure.

FIG. 4 illustrates an exemplary MEMS structure that includes a novel stator and rotor structure. When incorporated into a MEMS device, the MEMS structure enables a specific way to adjust electromechanical properties of a MEMS device by an applied voltage. Due to the proposed design, the capacitance in the MEMS device can therefore be formed differently so that the second derivative term $\partial C^2/\partial x^2$ in equation (5) can have also negative values. The proposed MEMS structure provides for a remarkably improved range for controlling the electromechanical properties of the MEMS device by means of an applied voltage.

For clarity, FIG. 4 includes only elements necessary to describe the principle of implementing the desired effect in MEMS devices. For a person skilled in the art it is clear that MEMS structures and MEMS devices typically include a plurality of further structural elements that are not specifically shown in the drawings herein.

The MEMS structure can be advantageously arranged into a planar form for alignment with a planar support structure. Directions parallel to the planar form of the MEMS structure are referred to as in-plane directions. Directions perpendicular to the planar form of the MEMS structure are referred to as out-of-plane directions. The MEMS structure includes at least one stator and at least rotor. The stator refers herein to parts of the MEMS structure that are anchored to the support structure such that they remain stationary in respect of the support structure. The rotor refers correspondingly to parts of the MEMS structure that are suspended to the support structure by one or more spring elements that allow at least one degree of freedom in respect of the support structure. In the exemplary configuration of FIG. 4, the spring structures suspend the rotor for motion in one in-plane direction, herein referred to as a first direction and denoted in FIG. 4 as X-direction.

For the desired control, the MEMS structure may be configured to comprise at least one capacitor element, a combination of one or more specific rotor elements and one or more specific stator elements coupled to form respectively one or more capacitors, the capacitance of which varies according to the displacement of the rotor in the first direction. The stator and the rotor elements include a plurality of protrusions that are arranged to face each other in a non-zero distance such that protrusion pairs are formed. These protrusion pairs form specific type of capacitors that implement the desired effect. The stator elements and rotor elements may be implemented in many forms. FIG. 4 illustrates an exemplary configuration, where the rotor includes a rotor frame 15 and the rotor elements are coupled to the rotor frame 15 by rotor support beams 7a-7d. In order to enable the X-direction movement of the rotor parallel to a plane of the support structure, the suspension of the rotor frame is stiff in the Y-direction and flexible in the X-direction. It is noted that many types of known spring structures providing a degree of freedom in a specific direction may be applied within the scope.

The rotor provides here an inertial mass that may move in respect of the static support. The rotor of FIG. 4 includes a rotor frame 15, which is movably anchored to a support structure (e.g. a substrate) by means of a spring structure. In FIG. 4, the suspending spring structure includes a first spring 4a and a second spring 4b. It is understood that in practice the inertial mass may take many forms and include also further mass structures, like comb structures that also move with the rotor frame 15 for further driving or sensing or quadrature compensation functions of the MEMS device, and/or rotor elements for other type of tuning of the electromechanical properties of the MEMS device. The inertial mass of the rotor is advantageously arranged to have point symmetry with respect to its center of mass CM, or reflectional symmetry in respect to an axis running through the center of mass CM.

The rotor frame 15 may comprise a first stiff beam 2a, a second stiff beam 2b, a third stiff beam 2c, and a fourth stiff beam 2d rigidly connected to each other at the ends of the stiff beams to form a rectangular-shaped or square-shaped frame that is parallel with the underlying support structure. In FIG. 4, the first spring 4a connects with the rotor frame 15 in the middle of the first stiff beam 2a, and the second spring 4b connects with the rotor frame 15 in the middle of the second stiff beam 2b that is parallel with the first stiff beam 2a. The springs 4a and 4b are rigidly anchored to rotor anchoring elements 50a, 50b within the movable rotor frame 15.

As will be described in more detail later, the rotor elements and stator elements include protrusions that are arranged to face each other in a distance. The role of the support beams in FIG. 4 is to provide a mechanical coupling between the rotor frame 15 and the one or more rotor elements, such that the protrusions in the one or more rotor elements initially face protrusions in respective stator elements, and the rotor elements are able to move parallel to a first direction in relation to the respective stator elements. In FIG. 4, the rotor frame 15 is shown to connect to rotor elements by rotor support beams 7a-7d, which are arranged to move rigidly along motions of the rotor frame 15. The configuration of FIG. 4 includes four rotor support beams, two of which 7a, 7b extend inwards from the third stiff beam 2c and perpendicular to the direction of the third stiff beam, and two of which 7c, 7d extend inwards from the fourth stiff beam 2d and perpendicular to the direction of the fourth stiff beam. The fourth stiff beam 2d is parallel to the third stiff beam 2c.

Figure 5:
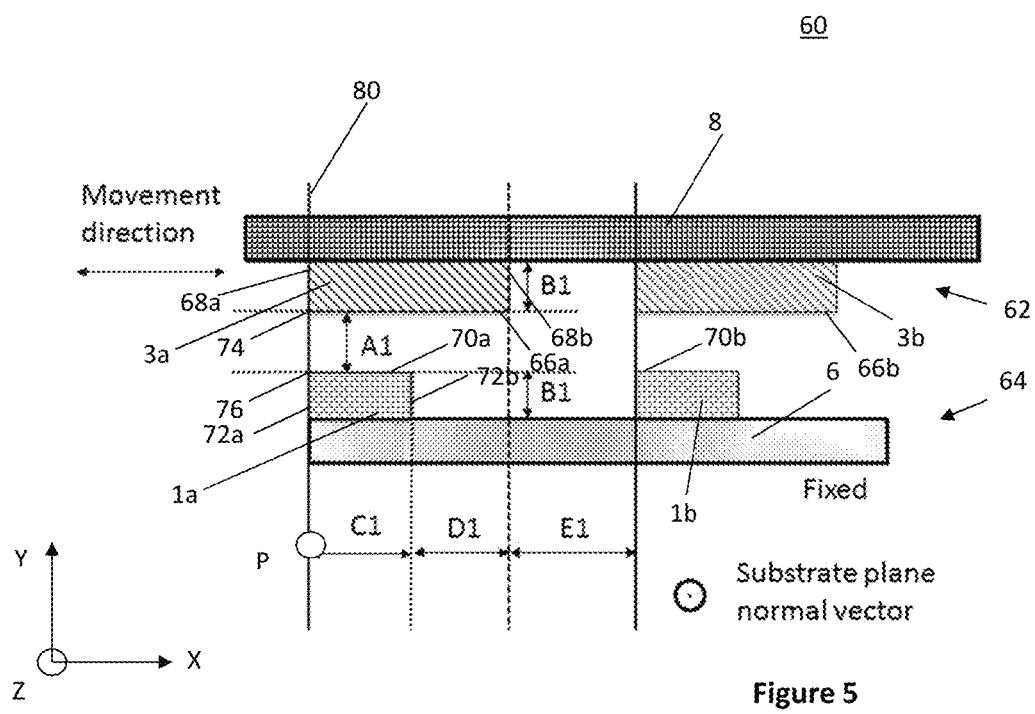
FIG. 5 illustrates details of a capacitor element of FIG. 4.

FIG. 5 illustrates in more detail an example of a capacitor element 60 that includes a rotor element 62 and a stator element 64.

A rotor element 62 refers here to a part of the rotor that includes a rotor beam 8 and a plurality (two or more) of rotor protrusions 3a, 3b that extend away from the rotor beam, i.e. extend to a direction that is perpendicular to a longitudinal dimension of the rotor beam. The rotor protrusions are dimensional elements such that their distal end is designed to provide planar rotor end surfaces 66a, 66b that are parallel to the direction of the rotor motion, i.e. the first direction. The rotor end surfaces are brought to a distance from the rotor beams by side walls of the protrusions. Two side wall surfaces that extend on opposite sides of a rotor protrusion (opposite when looked along the first direction) form rotor side surfaces 68a, 68b. The configuration in FIG. 5 is right-angled such that the rotor side surfaces 68a, 68b are orthogonal to a straight line in the first direction (X-direction in FIG. 5), and the rotor end surfaces 66a, 66b are orthogonal to a straight line in the second direction (Y-direction in FIG. 5).

A stator element 64 refers here to a part of the stator that includes a stator beam 6 and a plurality (two or more) of stator protrusions 1a, 1b that extend away from the stator beam 6, i.e. extend to the second direction. The stator protrusions are correspondingly dimensional elements, and their distal end is designed to provide planar stator end surfaces 70a, 70b that are parallel to the direction of the rotor motion, i.e. the first direction. The stator end surfaces are brought to a distance from the stator beams by side walls of the protrusions. Two side wall surfaces that extend on opposite sides of a stator protrusion (opposite when looked along the first direction) form stator side surfaces 72a, 72b. The configuration in FIG. 5 is right-angled such that the stator side surfaces 72a, 72b are orthogonal to a straight line in the first direction, and the stator end surfaces 70a, 70b are orthogonal to a straight line in the second direction.

In the exemplary configuration of FIG. 5, the rotor protrusions 3a, 3b extend from the rotor beam 8 perpendicularly outwards in the Y-direction, which is perpendicular to the X-direction movement of the rotor element, and parallel to the support structure that extends in the XY-plane. The rotor protrusions 3a, 3b include rotor side surfaces on opposite sides of each rotor protrusion. Each rotor side surface is thus in the YZ-plane that is perpendicular to the X-directed movement direction of the rotor element and perpendicular to the XY-plane of the support structure. Each of the rotor protrusions 3a, 3b includes a rotor end surface 66a, 66b in the distal end of the rotor protrusion. The rotor end surfaces are in the XZ-plane, which is parallel to the X-directed movement direction of the rotor and perpendicular to the XY-plane of the support structure. A rotor side edge 74 is formed between each rotor side surface and rotor end surface. In a right-angled configuration of FIG. 5, a line following the rotor side edge is aligned to the Z-direction, i.e. orthogonal both with respect to the X-directed first direction and the Y-directed second direction.

Similarly, the stator protrusions 1a, 1b may extend from the stator beam 6 perpendicularly outwards in the Y-direction, which is perpendicular to the X-direction movement of the rotor element, and parallel to the support structure that extends in the XY-plane. The stator protrusions 1a, 1b may include stator side surfaces 72a, 72b on opposite sides of each stator protrusion. Each stator side surface is thus in the YZ-plane that is perpendicular to the X-directed movement direction of the rotor element and perpendicular to the XY-plane of the support structure. Each of the stator protrusions 1a, 1b includes a stator end surface 70a, 70b in the distal end of the rotor protrusion. The stator end surfaces are in the XZ-plane, which is parallel to the X-directed movement direction of the rotor and perpendicular the XY-plane of the support structure. A stator side edge 76 is formed between each stator side surface and stator end surface. In a right-angled configuration of FIG. 5, a line following the stator side edge is aligned to the Z-direction, i.e. orthogonal both with respect to the X-directed first direction and the Y-directed second direction.

In initial position, the stator protrusions and the rotor protrusions are arranged into protrusion pairs so that the end surfaces of the protrusions of a protrusion pair at least partly overlap by facing each other on a distance, and side surfaces of the protrusions of a protrusion pair are aligned to a line in the second direction. The initial position refers here to a state of the structure when no external forces are applied and the spring structure is not flexed to either direction. In FIG. 5, a stator protrusion 1a and a rotor protrusion 3a form one protrusion pair and a stator protrusion 1b and a rotor protrusion 3b form another protrusion pair. Each of these protrusion pairs forms a capacitor with a capacitance that is proportional to an overlap between the stator end surface and the rotor end surface of the protrusion pair (linear comb structure).

The overlap of the end surfaces may be described using notations of FIG. 5. In FIG. 5, A1 denotes the distance between a stator protrusion 1a and a rotor protrusion 3a, B1 denotes the Y-directed height of a rotor protrusion 3a and also the Y-directed height of a stator protrusion 1a, C1 denotes the X-directed length of a stator protrusion 1a, D1 denotes the X-directed length difference between a stator protrusion 1a and a rotor protrusion 3a, and E1 denotes the distance between two adjacent rotor protrusions 3a, 3b. Thus C1+D1 is the length of a rotor protrusion 3a and D1+E1 is the distance between two stator protrusions 1a, 1b.

When the end surfaces 66a, 70a of the protrusions 1a, 3a of a protrusion pair at least partly overlap, orthogonal projection of the rotor end surface 66a of the rotor protrusion 3a onto a straight line in the first direction at least partly overlaps orthogonal projection of the stator end surface 70a of the stator protrusion 1a onto the same straight line in the first direction. In the right-angled structure of FIG. 5, the orthogonal projection of the rotor end surface 66a of the rotor protrusion 3a in the first direction equals to the sum C1+D1. The orthogonal projection of the stator end surface 70a of the stator protrusion 1a in the first direction equals to C1. In this example, the overlap in the initial position thus equals to C1.

In addition, at least one side surface of stator protrusion and one side of the rotor protrusion of a protrusion pair were defined to be aligned to a straight line in the second direction. In other words this means that an orthogonal projection of the rotor side edge and an orthogonal projection of the rotor side edge on a straight line in the first direction are arranged to coincide. In the right-angled structure of FIG. 5, the side surface 72a of the stator protrusion 1a and the side surface 68a of the rotor protrusion 3a are on the straight line 80. Point P thus represents the point where the orthogonal projections of the side edge of the rotor protrusions 3a and the stator protrusions 1a in the first direction coincide.

It is noted that FIG. 5 is not to scale, it is just shown to illustrate the meaning of the distances A1, B1, C1, D1, and E1 in an exemplary configuration.

In order to achieve the desired effect, the height B1 is advantageously 1 to 4 times, preferably 2 to 3 times the distance A1 (B1=Y×A1, wherein Y=1-4, preferably 2-3).

Correspondingly, the length C1 is advantageously 1 to 3 times, preferably 1.5 to 2.5 times, the distance A1 (C1=Y×A1, wherein Y=1-3, preferably 1.5-2.5).

Advantageously, the length D1 is 0.5 to 3.5 times, preferably 1.5 to 2.5 times the distance A1 (D1=Y×A1, wherein Y=0.5-3.5, preferably 1.5-2.5).

Advantageously, the distance E1 is 1 to 4 times, preferably 2 to 3 times, the distance A1 (E1=Y×A1, wherein Y=1-4, preferably 2-3).

In the described configuration, the end surfaces in the protruding parts of the stator and rotor elements may thus be arranged to an adjacent, non-zero distance from each other, which couples them to function as a capacitor. Upon movement of the rotor along the first direction X, the overlapping area of the end surfaces of the stator and rotor protrusions changes when the facing end surfaces of the stator and rotor protrusions move into different positions with respect to each other. This means that the extent of how much the end surfaces of the stator and rotor protrusions face each other changes. The facing end surfaces of the stator and rotor protrusions are on a distance A1 from each other both in the initial position, and during and after movement For example, the stator protrusion 1a and the rotor protrusion 3a facing the stator 1a on a distance may form a protrusion pair. When the rotor moves in the first direction, for example, to the negative X-direction, the overlap between the stator end surface 70a and the rotor end surface 66a changes. The two end surfaces 66a, 70a of the protrusion pair can thus be considered to form plates of an area modulated parallel plate capacitor, such that when the overlap decreases, the capacitance between the plates decreases, and vice versa. When the side surfaces 68a, 72a of the protrusions 1a, 3a are arranged to be aligned to the straight line, as described above, a small displacement of the rotor in the respective direction (in FIG. 5 to the negative X-direction) decreases the overlap and thus the capacitance between the end surfaces.

Figure 6A:
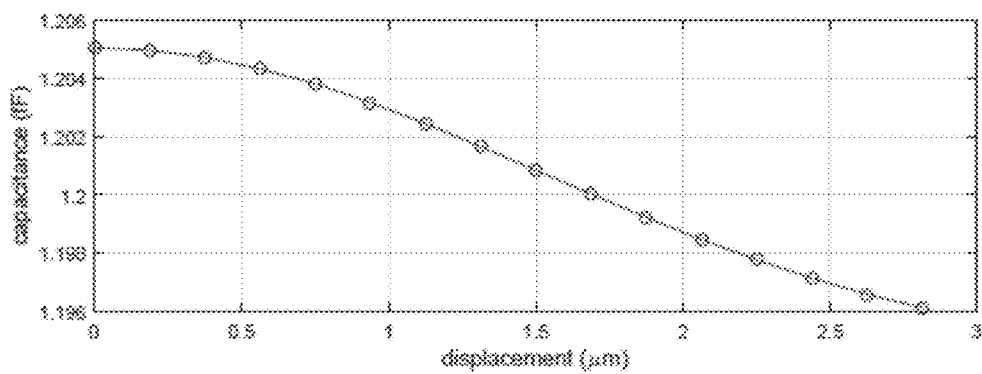
FIG. 6A illustrates capacitance in an exemplary capacitor element as a function of displacement of the rotor.
Figure 6B:
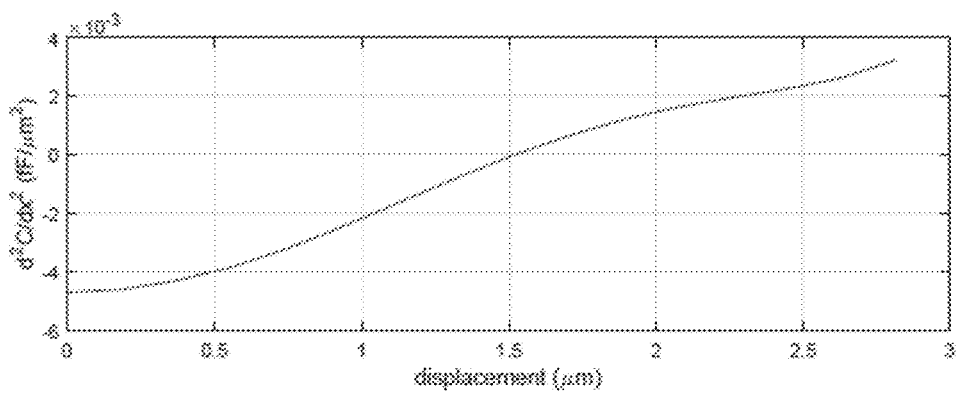
FIG. 6B illustrates behavior of the second derivative term $\partial C^2/\partial x^2$ as a function of displacement of the rotor.

FIG. 6A illustrates capacitance in an exemplary capacitor element with the claimed configuration as a function of displacement of the rotor. FIG. 6B illustrates corresponding behavior of the second derivative term $\partial C^2/\partial x^2$ as a function of displacement of the rotor. As may be seen from FIG. 6A, the capacitance is at maximum when the rotor element is in the initial position, and the overlap between the end surfaces is the greatest. When the displacement increases, the capacitance decreases. As may be seen from FIG. 6B, in a range of displacements, the curve of the second derivative term $\partial C^2/\partial x^2$ has negative values. The curve of the second derivative term $\partial C^2/\partial x^2$ has its minimum negative value immediately after the initial position, and rises along with the displacement.

Returning to FIG. 4, the protrusions may extend to one direction from a stator or rotor beam, or a stator or rotor beam may include protrusions that extend to two opposite directions from the stator or rotor beam. For example, in FIG. 4, a set of rotor protrusions of a rotor beam 17a coupled to the rotor with rotor support beam 7a extend to the positive Y-direction, and they are arranged to face one set of stator protrusions. Another set of rotor protrusions of the same rotor beam 17a extend to the negative Y-direction, and they are arranged to face another set of stator protrusions. On the other hand, a set of rotor protrusions of a rotor beam 17b, also coupled to the rotor with rotor support beam 7a extend to the positive Y-direction only. It is understood that there are several other ways to arrange protrusions of the stator and rotor elements into pairs, with and without the support beams. For example, in a further exemplary alternative of FIG. 4, there is no separate rotor beam or rotor support beam, but a part of the rotor frame acts as a rotor beam. FIG. 4 illustrates this alternative with rotor protrusions that are inside the rotor frame 15, arranged correspondingly to face the stator protrusions of a stator element on a non-zero distance from them.

As shown in FIG. 4, stator beams 8 may be transversally distributed along stator support beams 5a-5d, and arranged to extend in the first direction X into a space between the rotor beams 6. The rotor beams 6 may be transversally distributed along the rotor support beams 7a-7d, and extend in the first direction X into the space between the stator beams 8.

The capacitive MEMS structure of FIG. 4 is arranged to be reflectionally symmetrical in respect of a line in X-direction that crosses the center of mass CM of the rotor.

In an embodiment, the MEMS structure can be included in a MEMS accelerometer device. Acceleration sensors are usually designed for open-loop measurement, which restricts their use to a limited acceleration range achievable with the mechanical construction and the conventional electrical tuning methods of the spring constant. With the presented structure, the full scale deflection of the element may be more flexibly adjusted. It is thus possible to provide, for example, a multi-range accelerometer with a remarkably larger measurement range. On the other hand, designing high-g acceleration sensors can be challenging as the complete testing of the element would require also use of high accelerations (centrifuge instead of testing with gravity). The presented structure enables creating an accelerometer design that can be tested in low-g range and operated in high-g range.

In another embodiment, the presented MEMS structure can be included in a resonator, a MEMS device with a resonating structure. Frequency tuning with an applied voltage is a commonly used method to fine-tune resonance frequency of a resonating structure, for example in resonators and gyroscopes. Common shortcoming of conventional tuning methods is that they can only decrease the resonance frequency, and the tuning needs high voltages. The presented MEMS design enables one to create resonating structures where the resonance frequency can be both decreased and increased with applied voltages. Furthermore the voltages needed for tuning are lower due to the possibility to tune the frequency up and down.

In the exemplary MEMS structure of FIG. 5, the X-directed length C1+D1 of rotor end surface 66a is greater than the X-directed length C1 of stator end surface 70a. Accordingly, a displacement of the rotor in the positive X-direction causes a change in capacitance immediately after the initial position. On the other hand, when the rotor is displaced in the negative X-direction, the overlap area between the end surfaces of the protrusions remains the same even if the rotor moves from the initial position. Accordingly, the difference in the protrusion dimensions makes it possible to design the capacitor elements such that also direction of the rotor movement can be detected. This is an important aspect especially in accelerometer design.

For example, FIG. 4 shows a configuration where the X-directed length of stator end surfaces is less than the X-directed length of rotor end surfaces. The rotor elements in the upper part of the MEMS structure are coupled to the rotor frame 15 through rotor support beams 7a and 7b, and stator elements are coupled to a stator anchoring element 30a through stator support beams 5a and 5b. The stator elements are thus in the same potential and all capacitor elements in the upper part can contribute jointly to the detected capacitance variations. These upper capacitor elements are oriented such that displacement of the rotor in the positive X-direction causes a change in capacitance immediately after the initial position. On the other hand, when the rotor is displaced in the negative X-direction, the overlap between the end surfaces in the capacitor elements remains the same and the detected capacitance does not change.

The rotor elements in the lower part of the MEMS structure are coupled to the rotor frame 15 through rotor support beams 7c, 7d, and stator elements are coupled to an anchoring element 30b through stator support beams 5c, 5d. These lower capacitor elements are oriented such that displacement of the rotor in the negative X-direction causes a change in capacitance immediately after the initial position. On the other hand, when the rotor is displaced in the positive X-direction, the capacitance does not immediately change.

Accordingly, the upper capacitor elements may be positioned to sense in combination displacements of the rotor in the positive X-direction, and lower capacitor elements to sense in combination displacements of the rotor in the negative X-direction. The range of sensitivity of the MEMS structure can be adjusted with an applied voltage, as described above. In the configuration of FIG. 4, the stator support beams 5a, 5b are coupled through the stator anchoring element 30a to a first potential, and the stator support beams 5c, 5d through another anchoring element 30b to a second potential. The first potential and the second potential are advantageously the same.

Figure 7:
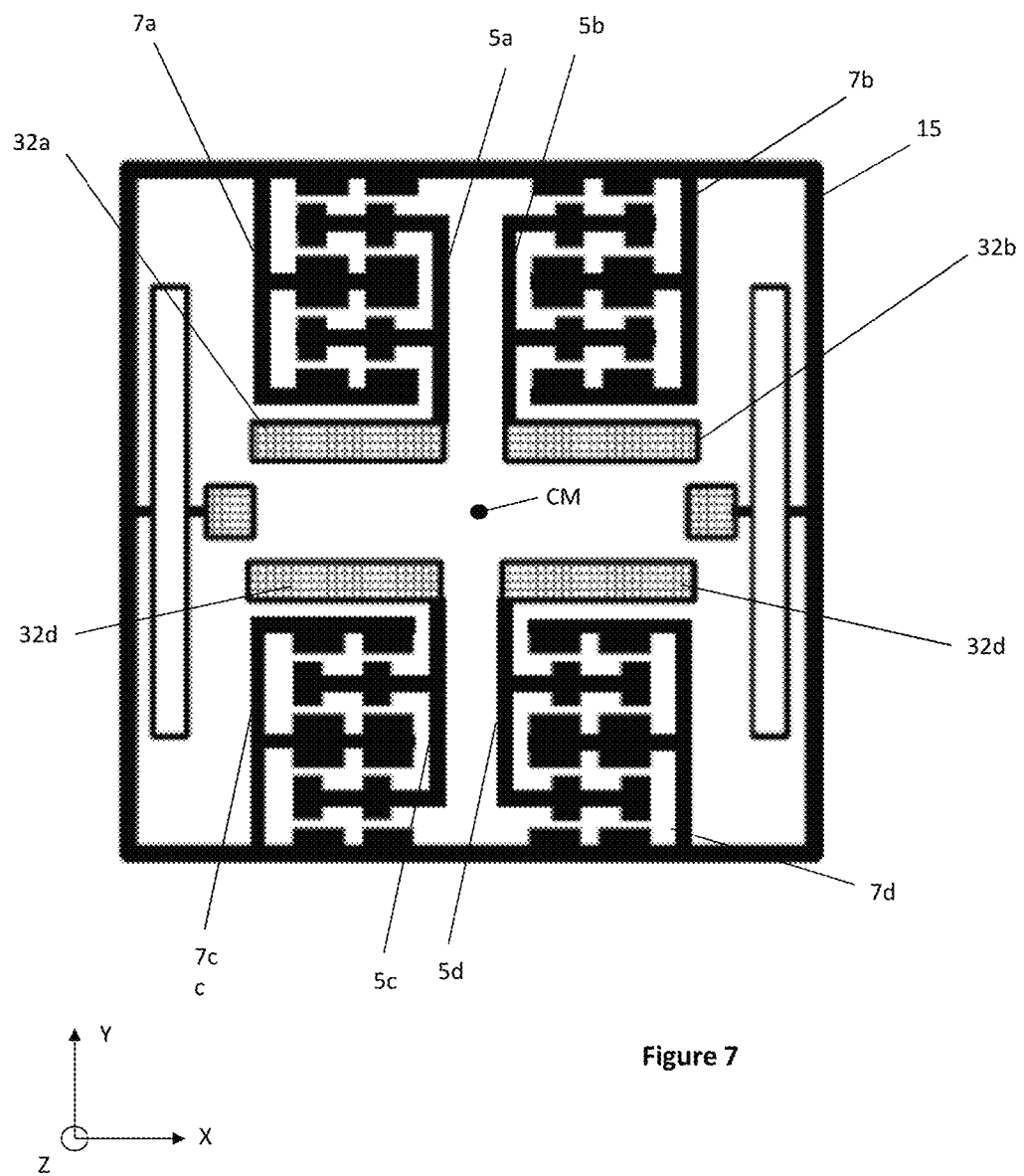
FIG. 7 illustrates an alternative configuration for a MEMS structure suspended for in-plane motion of the rotor.

FIG. 7 illustrates an alternative configuration for the MEMS structure suspended for in-plane motion. Also this MEMS structure is specifically applicable for accelerometer use, and provides the possibility to detect also the movement direction of the rotor. In addition, the illustrated configuration enables reduction in measurement error by differential detection.

The MEMS structure of FIG. 7 corresponds to that of FIG. 4, but includes four stator anchoring elements 32a-32d instead of two. Each stator anchoring element 32a-32d supports one stator support beam 5a, 5b, 5c or 5d anchored thereto.

The capacitive micromechanical sensor structure of FIG. 7 is reflectionally symmetrical in both X-direction and Y-direction. A line of symmetry is a horizontal line in the X-direction across the middle of the element structure, advantageously a horizontal line crossing the center of mass CM of the rotor. Another line of symmetry is a line that is perpendicular to the horizontal line, and also runs in the Y-direction through the middle of the element structure, advantageously also crossing the center of mass CM of the rotor.

Let us denote that stator elements coupled to a first anchoring element 32a through a first stator support beam 5a and rotor elements coupled to the rotor frame 15 through the first rotor support beam 7a form a first detection element. Correspondingly, stator elements coupled to a second anchoring element 32b through a second stator support beam 5b and rotor elements coupled to the rotor frame 15 through the second rotor support beam 7b form a second detection element. Stator elements coupled to a third anchoring element 32c through a third stator support beam 5c and rotor elements coupled to the rotor frame 15 through the third rotor support beam 7c form a second detection element, and stator elements coupled to a fourth anchoring element 32d through a fourth stator support beam 5d and rotor elements coupled to the rotor frame 15 through the fourth rotor support beam 7d form a fourth detection element.

In the MEMS structure of FIG. 7, the first, second, third and fourth detection elements are positioned such that the first and the third detection element detect displacements of the rotor in the positive X-direction, and the second and the fourth detection element detect displacements of the rotor in the negative X-direction. The output signal of the MEMS structure may be arranged to correspond with the difference between the sum of contributions by the first and the third detection element and the sum of contributions by the second and the fourth element. Such differential detection helps to eliminate effects of manufacturing errors and temperature variations in the MEMS device configuration.

Figure 8:
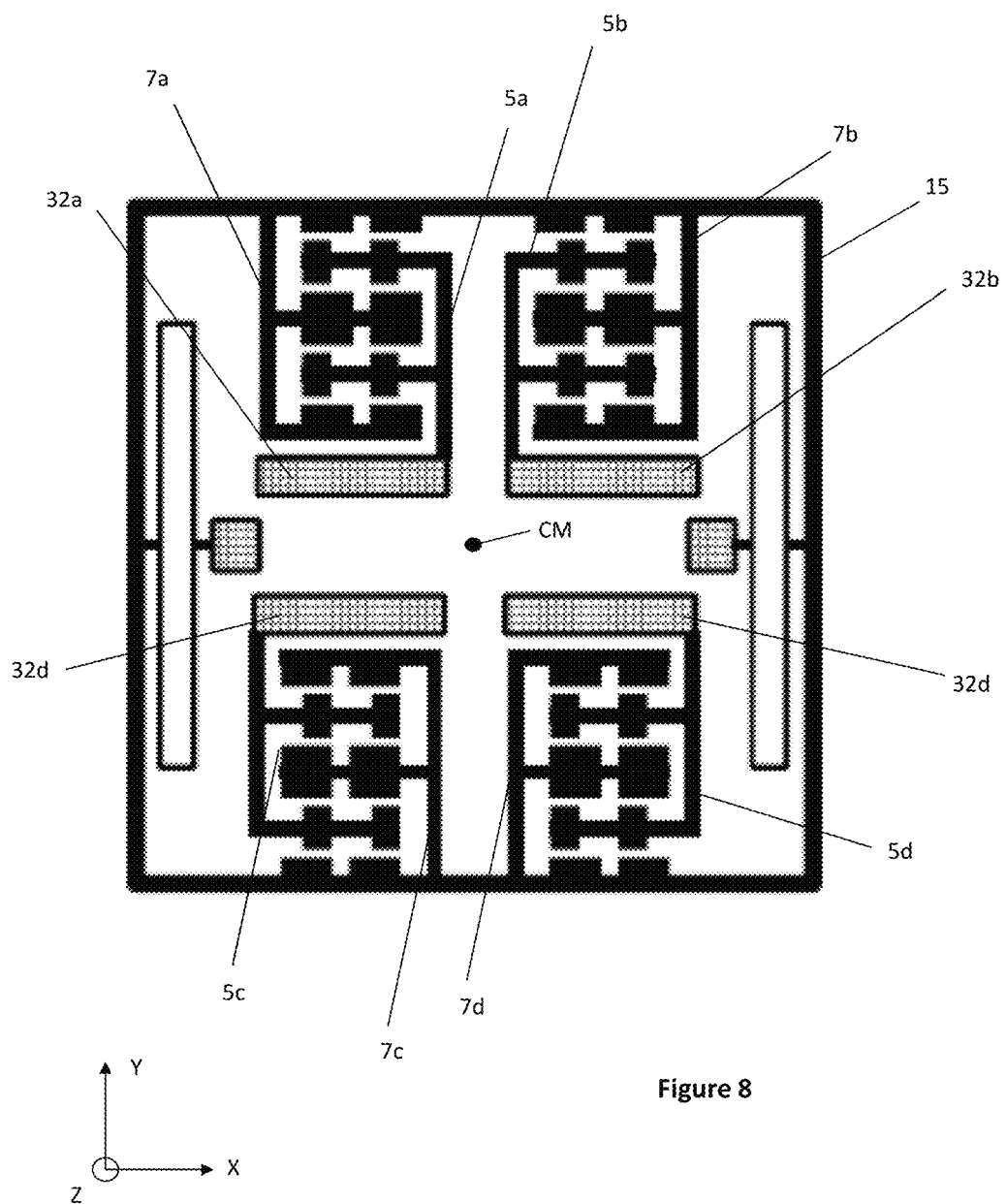
FIG. 8 illustrates a further alternative configuration for a MEMS structure suspended for in-plane motion of the rotor.

FIG. 8 illustrates an alternative configuration for a MEMS structure that provides the possibility to detect in-plane movement direction of the rotor, and enables elimination of errors by differential detection.

The MEMS element of FIG. 8 otherwise corresponds to that of FIG. 7, but the detection elements are differently positioned for differential detection. The MEMS structure of FIG. 85 is reflectionally symmetrical in the Y-direction. The line of symmetry is aligned to Y-direction across the middle of the element structure, and advantageously crosses the center of the mass CM of the rotor.

In the MEMS structure of FIG. 8, the first, second, third and fourth detection elements are positioned such that the first and the fourth detection element detect displacements of the rotor in the positive X-direction, and the second and the third detection element detect displacements of the rotor in the negative X-direction. The output signal may correspond with the difference between the sum of contributions by the first and the fourth detection element and the sum of contributions by the second and the third element. The differential detection helps to eliminate effects of manufacturing errors and temperature variations in the MEMS device configuration. The cross-coupled configuration coupling the first and the fourth detection elements, and the second and the third detection elements placed cross-wise parallel to the support structure may be even more effective in eliminating effects of some manufacturing errors and temperature variations in the MEMS device configuration.

In FIGS. 4, 5, 7 and 8, the rotor protrusions 3 and the stator protrusions 1 are of mutually different length in the X-direction to enable direction detection, as described above. In the exemplary embodiments, the rotor protrusions and the stator protrusions are of the same height in the Y-direction. This is advantageous for symmetry and mass distribution of the rotor. However, also configurations with different heights in the Y-direction may be applied within the scope. Furthermore, in FIGS. 4, 5, 7 and 8 the X-direction length of the rotor protrusions is greater than that of the stator protrusions. However, configurations where X-direction length of the stator protrusions is greater than that of the rotor protrusions may also be applied within the scope.

Figure 9:
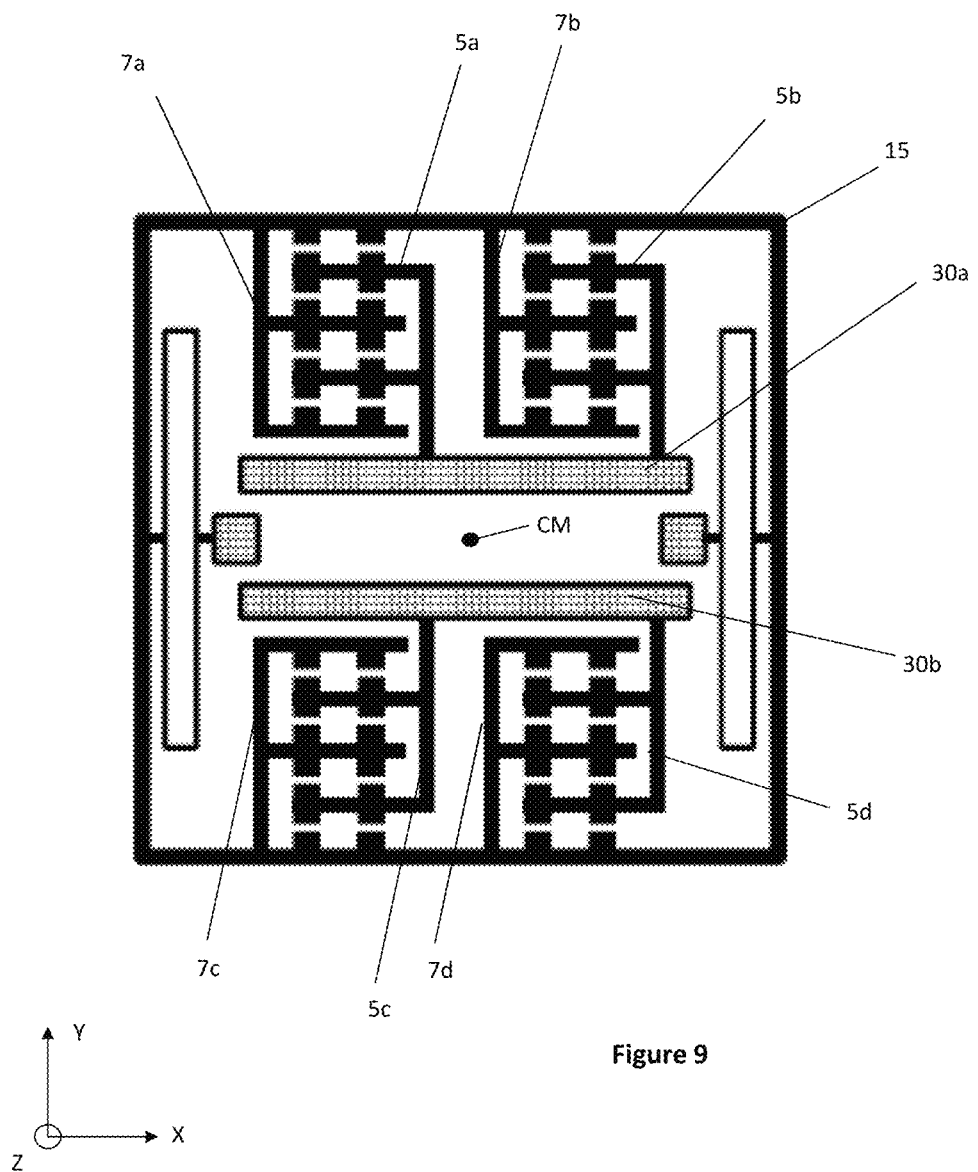
FIG. 9 illustrates an in-plane moving MEMS structure applicable in resonator implementations.

In resonator applications, the directional aspect in the detected capacitances is not that applicable, and the overlap may be allowed to change by displacements of the rotor from the initial position in both directions. FIG. 9 shows an in-plane moving MEMS structure specifically useful for resonator applications. The MEMS element of FIG. 9 otherwise corresponds to that of FIG. 4 but the X-direction lengths of the stator protrusions and the rotor protrusions are equal, or almost equal.

The capacitive micromechanical sensor structure of FIG. 9 is reflectionally symmetrical in the X-direction. The line of symmetry is a horizontal line in the X-direction across the middle of the element structure, advantageously crossing the center of mass CM of the rotor.

In the configuration of FIG. 9, the stator support beams 5a, 5b are coupled through a stator anchoring element 30a to a first potential, and the stator support beams 5c, 5d through another stator anchoring element 30b to a second potential. The first potential and the second potential are advantageously the same. The first, second, third and fourth detection elements are positioned such that the first and second detection elements that include the upper capacitor elements contribute to a signal in combination, and the third and the fourth detection elements that include the lower capacitor elements contribute to another signal in combination. Alternative differential configurations that correspond with configurations of FIGS. 7 and 8 may be applied, as well. With the disclosed configurations, the resonance frequency of the resonator can be effectively adjusted with an applied voltage, as described above.

Figure 10:
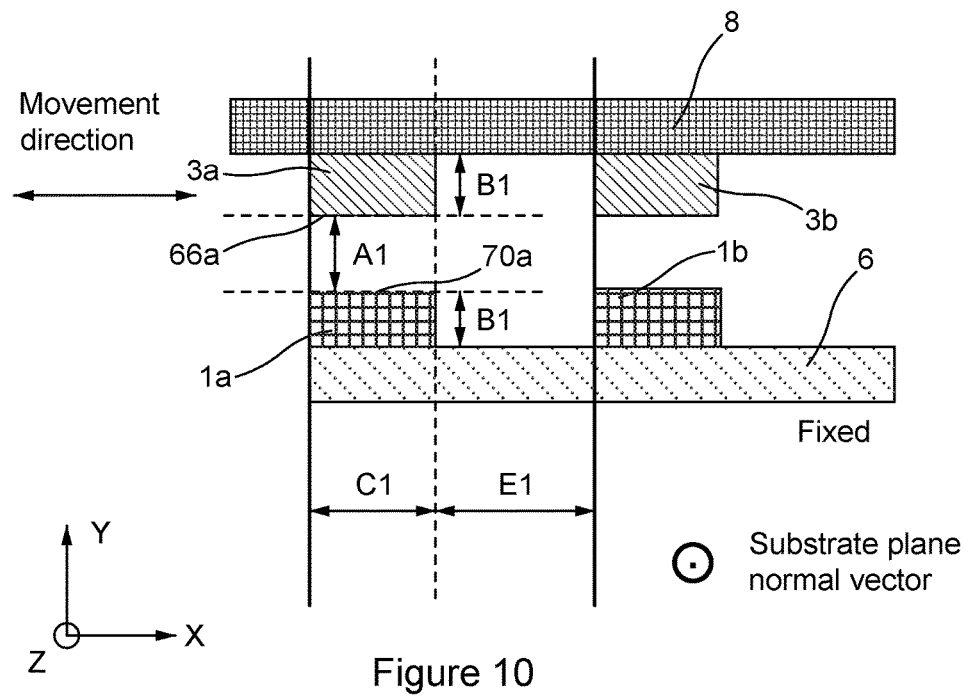
FIG. 10 illustrates details of a capacitor element of FIG. 9.

FIG. 10 presents a partial detail view of an exemplary MEMS structure of FIG. 9. The denotations are similar to the ones used in FIG. 5. A1 denotes the distance between a stator protrusion 1a and a rotor protrusion 3a, B1 denotes the Y-directed height of a rotor protrusion 3a and also the Y-directed height of a stator protrusion 1a, C1 denotes the X-directed length of a stator protrusion 1a, D1 denotes the X-directed length difference between a stator protrusion 1a and a rotor protrusion 3a, and E1 denotes the distance between two adjacent rotor protrusions 3a, 3b. Thus C1+D1 is the length of a rotor protrusion 3a and D1+E1 is the distance between two stator protrusions 1a, 1b. As may be seen from FIG. 9, in initial position, the stator end surface 70a of each stator protrusion 1a fully overlaps the rotor end surface 66a of a respective rotor protrusion 3a that faces it in a distance. When the rotor moves from the initial position, the overlap of the end surfaces and thereby the capacitance between them changes. It is pointed out that FIG. 10 is not in scale, it is just shown to illustrate the meaning of the denotations A1, B1, C1, D1 and E1.

Figure 11:
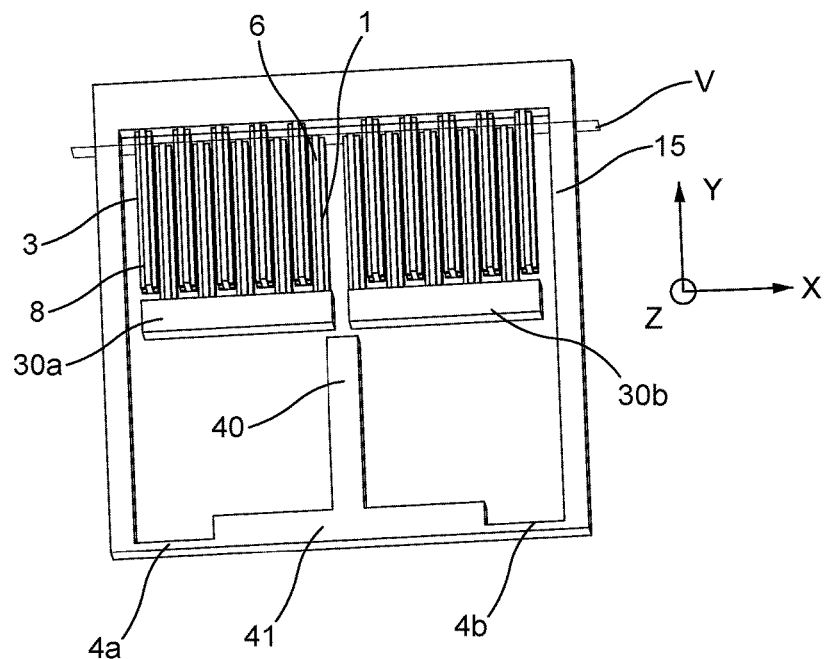
FIG. 11 illustrates an exemplary MEMS structure with an out-of-plane moving rotor configuration.

In the previous embodiments, the rotor motion has been arranged to take place in the in-plane direction, i.e. parallel to the plane of an underlying support structure. However, the described structures may be applied also to MEMS structures with out-of-plane moving elements. FIG. 11 shows an exemplary MEMS structure with an out-of-plane moving rotor configuration, specifically applicable for accelerometer use. Elements corresponding to elements in the earlier embodiments are denoted with same numerals, and more information on them may be referred from the earlier description.

The MEMS structure comprises again at least one stator that is rigidly anchored to a support structure and at least one rotor movably anchored by a flexural spring structure to the support structure. In FIG. 11, the substrate plane is parallel to the XY-plane and the movement of the rotor is arranged to take place parallel to the Z-direction. Accordingly, in the configuration of FIG. 11, the Z-direction is the first direction and the X-direction is the second direction. In the configuration of FIG. 11, the stator includes stator anchoring elements 30a, 30b, and a plurality of stator beams 6 coupled to the anchoring elements 30a, 30b. The stator beams 6 extend from a respective anchoring element in the Y-direction, and have also a height dimension in the Z-direction. Each stator beam 6 includes a plurality (two or more) stator protrusions 1. The stator protrusions 1 extend from the stator beam 6 in the X-direction outwards from stator beams 6 and perpendicular to the Z-directed movement direction (first direction) of the rotor element.

As shown in FIG. 11, the rotor is suspended from a rotor anchoring element 40 through a rigid rotor support structure 41 and with suspension springs 4a, 4b. The rotor includes a rotor frame 15 that may be induced into rotational movement about an axis running through the torsional springs 4a, 4b. A plurality of rotor beams 8 extend inwards from the distal end of the rotor fame 15 in the Y-direction, and have also a height dimension in the Z-direction. The rotor beams 8 include a plurality of rotor protrusions 3 distributed along the height dimension of each rotor beam 8. The rotor protrusions 3 extend from the rotor beams 8 in the X-direction outwards from the rotor beam 8, i.e. in a direction perpendicular to the Z-directed movement direction of the rotor element.

Figure 12:
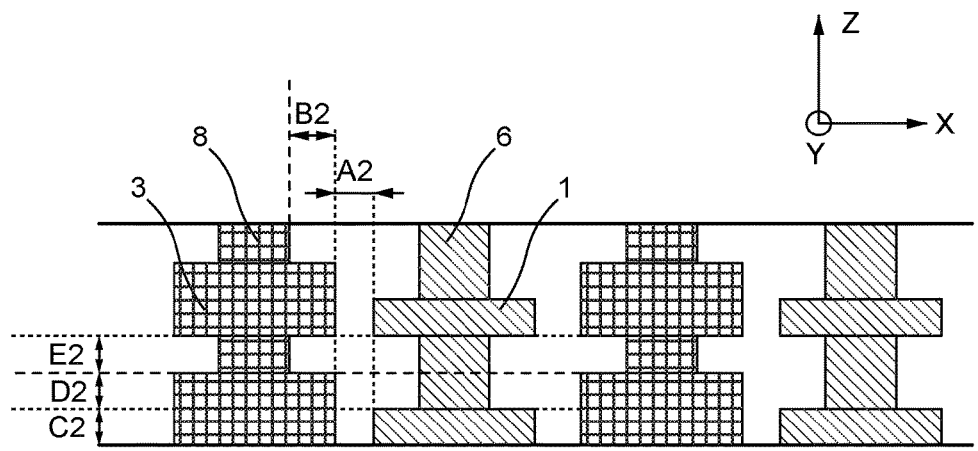
FIG. 12 illustrates details of a capacitor element of FIG. 11.

FIG. 12 illustrates the configuration shown in FIG. 11 with a partial detail cross-sectional view of a part of a MEMS structure, only with a smaller amount of beams than FIG. 11. As described with FIG. 12, each stator protrusion 1 includes stator side surfaces 72a, 72b on opposite sides of the stator protrusion 1. Each stator side surface is parallel with the XY-plane. Each stator protrusion 1 also includes a stator end surface 70 in the distal end of the stator protrusion 1, wherein the stator end surface is parallel with the YZ-plane.

As also shown in FIG. 12, each rotor protrusion 3 includes rotor side surfaces 68a, 68b on opposite sides of the rotor protrusion 3, each rotor side surface 68a, 68b being parallel to the XY-plane. Each rotor protrusion 3 also includes a rotor end surface in the distal end of the rotor protrusion, wherein the rotor end surface is parallel with the YZ-plane. The rotor protrusions 3 may extend from one side or from both sides of the rotor beam 8. The stator protrusions 1 and the rotor protrusions 3 are arranged into protrusion pairs so that a protrusion pair can include stator and rotor protrusions of adjacent stator and rotor beams.

In this exemplary embodiment, the rotor frame is a U-shaped structure with two side beams and an end beam. As shown in FIG. 11, one of the side beams of the rotor frame 15 is connected at one end by a first spring 4a to a rotor support structure 41. The opposite side beam of the element frame 15 is connected at one end by a second spring 4b to the same rotor support structure 41. The opposite side beams of the element frame are parallel with a central axis of the element structure. The rotor support structure 41 may be rigidly anchored to the substrate at a rotor anchoring element 40. In order to enable a Z-directed movement direction of the rotor element perpendicular to the XY-plane of the substrate, the springs 4a, 4b are torsionally flexible and thereby enable the rotational out-of plane motion of the rotor.

In FIG. 11, the stator beams 6 (on which there are stator protrusions 1) are shown to extend into the space between the rotor beams 8 (on which there are rotor protrusions 3). The stator and the rotor thus include two groups, where rotor beams of both groups are in the same potential, but stator beam groups can be coupled to a same potential or a different potential.

In the groups of stator and rotor beams, the stator beams 6 face a space between the rotor and stator element groups and the rotor beams 8 are outmost. The sides of the stator beams 6 that face the first space between the groups can include protrusions, as shown in FIG. 11, or be free from stator protrusions. Correspondingly, the sides of the rotor beams 8, that face the rotor frame 15 can include protrusions, as shown in FIG. 11, or be free of rotor protrusions.

The MEMS structure of FIG. 11 is reflectionally symmetrical in the Y-direction. The stator and rotor element groups preferably comprise the same number of protrusion pairs so that the groups are disposed symmetrically with respect to a Y-directed axis of the MEMS structure that crosses the center of mass CM of the rotor.

FIG. 12 illustrates in more detail the stator beams 6 with stator protrusions 1 and the rotor beams 8 with rotor protrusions 3. In this exemplary embodiment, the rotor protrusions 3 and the stator protrusions 1 have mutually different heights in the Z-direction (the moving direction), and thereby enable detection of direction of the rotor movement, as well. In the embodiment of FIG. 12, in one of the rotor and stator element pair, the Z-direction height of the rotor protrusions 3 is greater than the Z-directed height of the stator protrusions 1. A configuration where the Z-direction height of the stator protrusions 1 is greater than the Z-directed height of the rotor protrusions 3 may be applied within the scope, as well.

FIG. 12 illustrates in more detail also dimensions of the stator and rotor elements described in FIG. 11. In FIG. 11, A2 denotes the distance between the facing end surfaces of a stator protrusion 1 and a rotor protrusion 3, B2 denotes the X-directed length of a rotor protrusion 3 from the rotor beam 8, i.e. the distance of the distal end of a rotor protrusion 3 to the rotor beam 8. C2 denotes the Z-directed height of a rotor protrusion 1, D2 denotes the height difference between a rotor protrusion 3 and a stator protrusion 1 and E2 denotes the distance between two rotor protrusions 3.

It is pointed out that FIG. 11 is not in scale, it is just shown to illustrate the meaning of the distances A2, B2, C2, D2 and E2.

Distance B2 is advantageously 1 to 4 times, preferably 2 to 3 times, distance A2 (B2=Y×A2, wherein Y=1-4, preferably 2-3).

Distance C2 is advantageously 1 to 3 times, preferably 1.5. to 2.5 times, distance A2 (B2=Y×A2, wherein Y=1-3, preferably 1.5-2.5).

Distance D2 is advantageously 0.5 to 3.5 times, preferably 1.5 to 2.5 times, distance A2 (D2=Y×A2, wherein Y=0.5-3.5, preferably 1.5-2.5).

Distance E2 is advantageously 1 to 4 times, preferably 2 to 3 times, distance A2 (D2=Y×A2, wherein Y=1-4, preferably 2-3).

Figure 13:
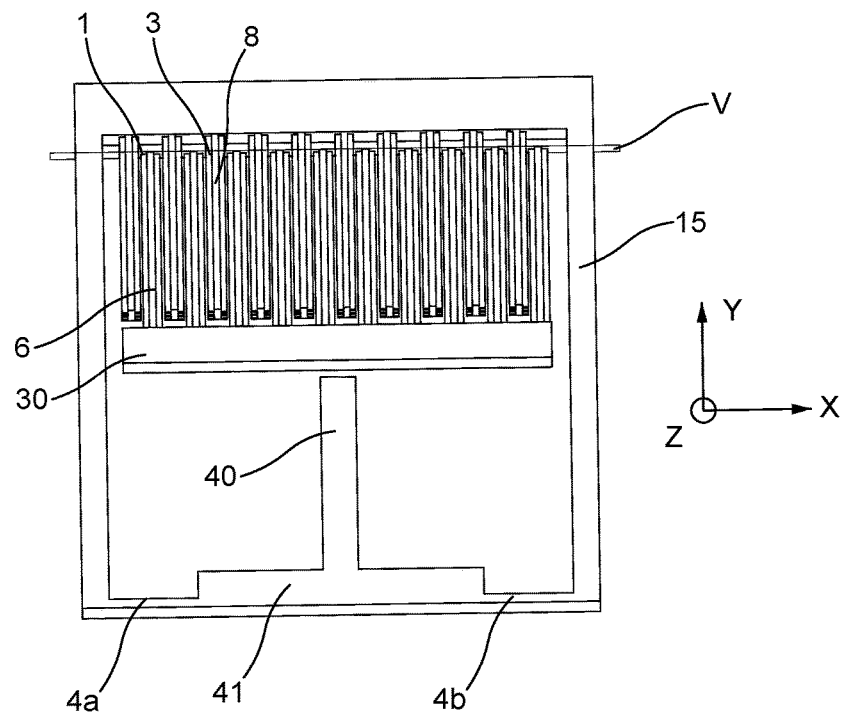
FIG. 13 illustrates an exemplary MEMS structure with an out-of-plane moving rotor for use in resonator applications.

FIG. 13 presents an exemplary MEMS structure with an out-of-plane moving rotor for use in resonator applications. The structure provides for the enhanced tuning, as described above, but does not enable detection of the movement direction. The structure of FIG. 13 is similar to that of FIG. 11, and the reference numbers thus relate to similar entities, if not stated otherwise.

The stator element includes a plurality of stator beams 6 anchored in the Y-direction to a stator anchoring element 30 and a plurality of rotor beams 8 rigidly connected in the Y-direction to the rotor frame 15 placed on a support structure (not shown). Thus, in FIG. 13, there is only one group of stator and rotor beams. Each stator beam 6 has several stator protrusions 1 that extend along the Z-direction dimension of each stator beam 6 in the X-direction, and several rotor protrusions 3 that extend in the Z-direction dimension along each rotor beam 8 in the X-direction. The stator protrusions and the rotor protrusions for protrusion pairs otherwise like in FIG. 11, but in FIG. 13, the stator and rotor protrusions are of the same height in the Z-direction.

The rotor and stator beams are interleaved like in the MEMS structure of FIG. 11. The capacitive micromechanical sensor structure of FIG. 13 has reflectional symmetry in respect of an axis the Y-direction.

Figure 14:
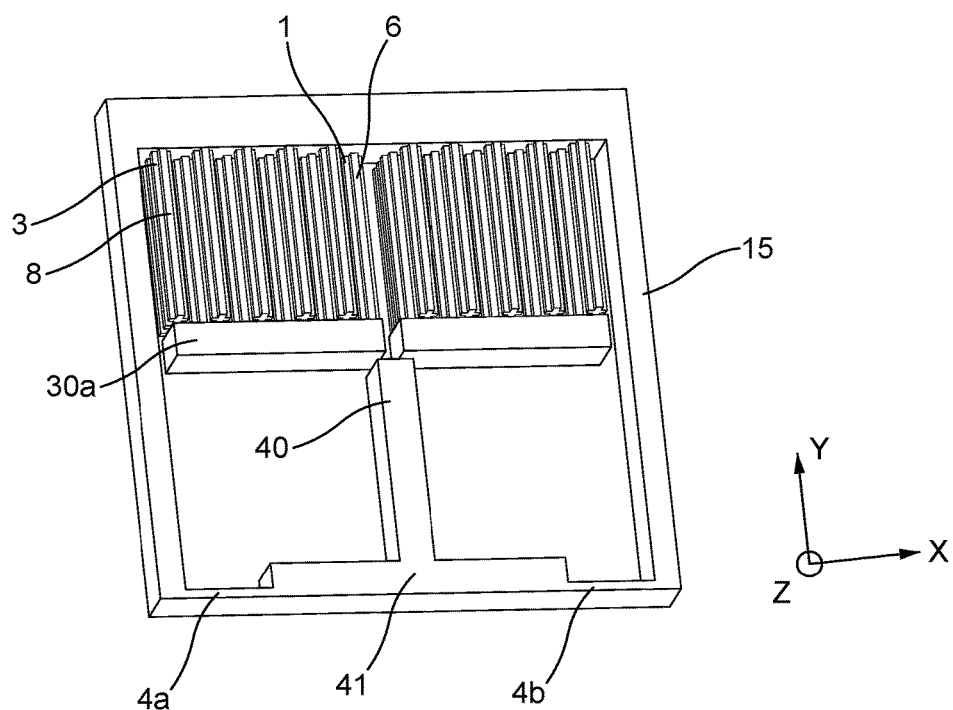
FIG. 14 illustrates a further exemplary configuration for a MEMS where the rotor beams and stator beams are arranged into two groups.

FIG. 14 shows a further exemplary configuration for a MEMS structure. In this embodiment, the rotor beams 8 and stator beams 6 are arranged into two groups, as in FIG. 11. The stator beams 6 of one of the groups are anchored to the stator anchoring element 30*a* and the stator beams 6 in the other group are anchored to the stator anchoring element 30*b*. The Z-directed height dimension of the rotor protrusions is equal to the Z-directed height dimension of the stator protrusions, as in the MEMS structure of FIG. 13.

Figure 15:
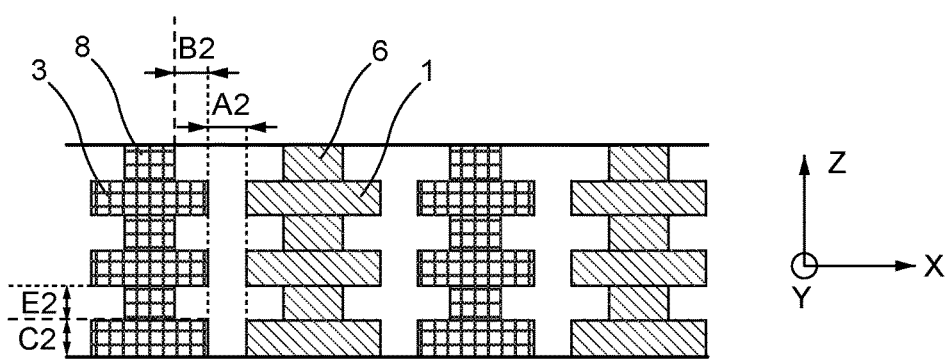
FIG. 15 illustrates details of a capacitor element of FIG. 13.

FIG. 15 illustrates the configuration presented in FIG. 14 with a partial detail cross-sectional view of stator and rotor elements in a similar structure, only with a different number of stator and rotor beams. The cross section of FIG. 15 is taken along plane V of FIG. 14. As shown, the stator beams 6 include stator protrusions 1, and the rotor beams 8 include rotor protrusions 3. It can be seen that the rotor protrusions 3 and the stator protrusions 1 are of the same height in the Z-direction (the first direction, the moving direction of the rotor).

FIG. 15 illustrates also dimensions of rotor and stator protrusions along the Z-directed dimension of stator and rotor beams, applicable in MEMS structures of FIGS. 13-14. Like in FIGS. 13-14, reference number 3 denotes rotor protrusions and reference number 1 stator protrusions. A2 denotes the distance between the facing end surfaces of a stator protrusion 1 and a rotor protrusion 3, B2 denotes the X-directed length of a rotor protrusion 3 from the rotor beam 8, i.e. the distance of the distal end of a rotor protrusion 3 to the rotor beam 8. C2 denotes the Z-directed height of a rotor protrusion 3 and also the Z-directed height of a stator protrusion 1, and E2 denotes the distance between two rotor protrusions 3 and also the distance between two stator protrusions 1. It is pointed out that FIG. 15 is not in scale, it is just shown to illustrate the meaning of the distances A2, B2, C2 and E2.

Distance B2 is advantageously 1 to 4 times, preferably 2 to 3 times, distance A2 (B2=Y×A2, wherein Y=1-4 preferably 2-3).

Distance C2 is advantageously 1 to 3 times, preferably 1.5. to 2.5 times, distance A2 (B2=Y×A2, wherein Y=1-3, preferably 1.5-2.5).

Distance D2 is advantageously 0.5 to 3.5 times, preferably 1.5 to 2.5 times, distance A2 (D2=Y×A2, wherein Y=0.5-3.5, preferably 1.5-2.5).

Distance E2 is advantageously 1 to 4 times, preferably 2 to 3 times, distance A2 (D2=Y×A2, wherein Y=1-4, preferably 2-3).

Figure 16:
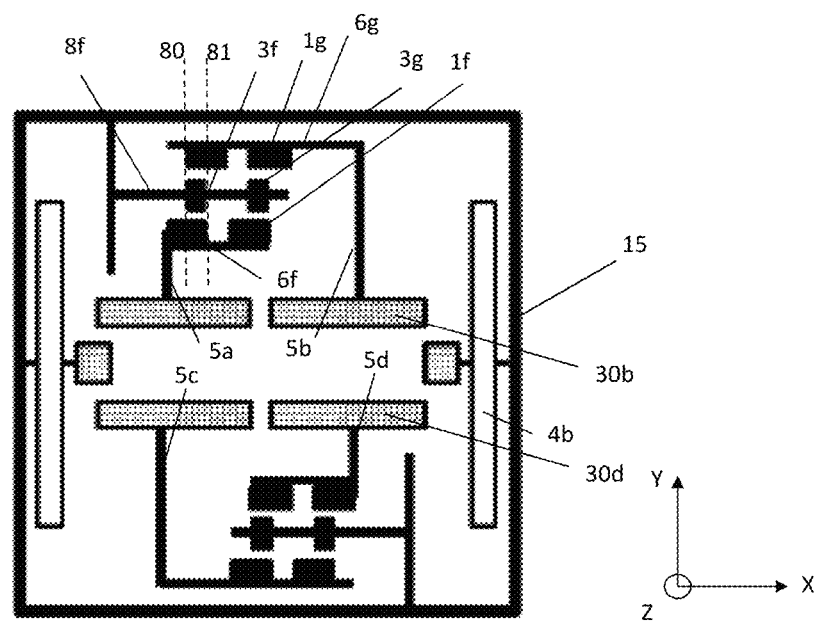
FIG. 16 illustrates a further embodiment for an in-plane configuration.

FIG. 16 illustrates a further embodiment for an in-plane configuration, i.e. a MEMS structure with an in-plane moving rotor. The embodiment enables the possibility to use differential detection, and detect also the movement direction. The described MEMS structure is therefore again specifically applicable for accelerometer use.

In the MEMS structure of FIG. 16, there are four stator anchoring elements 30*a*-30*d*, to which one or more (one shown) stator support beams 5*a*, 5*b*, 5*c* or 5*d* are coupled to. In the configuration of FIG. 16, a rotor beam 8*f* is interleaved between stator beams 6*f* and 6*g*. The stator element of the stator beam 6*f* includes a plurality of stator protrusions 1*f* that extend in the positive Y-direction from the stator beam 6*f* towards the rotor beam 8*f*. The stator element of the stator beam 6*g* includes a plurality of stator protrusions 1*g* that extend in the negative Y-direction from the stator beam 6*g* towards the rotor beam 8*f*. The rotor element of the rotor beam 8*f* includes a plurality of rotor protrusions 3*f* that extend in the negative Y-direction towards the stator beam 6*f*, and a plurality of rotor protrusions 3*g* that extend in the positive Y-direction towards the stator beam 6*g*. A stator protrusion 1*f* and a rotor protrusion 3*f* form a protrusion pair, wherein a side surface of stator protrusion 1*f* and a side surface of the rotor protrusion 3*f* of the protrusion pair run along on a straight line 81 in the Y-direction. A stator protrusion 1*g* and a rotor protrusion 3*g* form another protrusion pair, where a side surface of stator protrusion 1*g* and a side surface of the rotor protrusion 3*g* of the protrusion pair run along a straight line 80 in the Y-direction.

Due to the specific alignment, movement of the rotor in the positive X-direction causes a change in the overlap, and thus in capacitance between capacitors formed by protrusions of the stator element supported by the stator support beam 5b and protrusions of the rotor element supported by the rotor support beam 7a. On the other hand, movement of the rotor in the negative X-direction causes a change in the overlap, and thus in capacitance between capacitors formed by protrusions of the stator element supported by the stator support beam 5a and protrusions of the rotor element supported by the rotor support beam 7a.

Let us denote contributions by capacitors formed between protrusions of the rotor element supported by the rotor support beam 7a and protrusions of the stator element supported by the stator support beam 5a as S1, and of contributions by capacitors formed between protrusions of the rotor element supported by the rotor support beam 7a and protrusions of the stator element supported by the stator support beam 5b as S2. Correspondingly, let us denote contributions by capacitors formed between protrusions of the rotor element supported by the rotor support beam 7b and protrusions of the stator element supported by the stator support beam 5c as S3, and of contributions by capacitors formed between protrusions of the rotor element supported by the rotor support beam 7b and protrusions of the stator element supported by the stator support beam 5d as S4. Differential output signal S may then be derived as $$S=(S2+S3)-(S1+S4)$$

Figure 17:
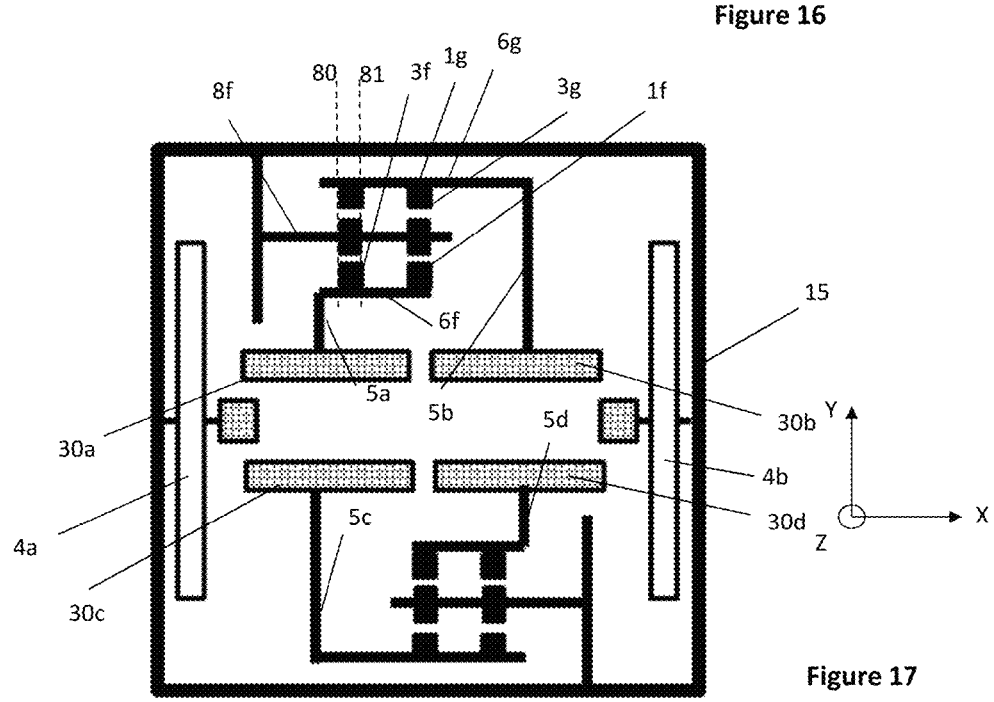
FIG. 17 illustrates the embodiment of FIG. 16 applicable in resonator implementations.

FIG. 17 illustrates a corresponding configuration for resonator applications. The MEMS structure is by far similar to the MEMS structure, but the X-directed length of the stator protrusions may now be equal to the X-directed length of the rotor protrusions.

The embodiments described in the figures are only examples of structures that fulfill the inventive idea. One skilled in the art can do suitable modifications in accordance with the inventive features as presented in the claims.
In the above embodiments, the following aspects may be applied:
  the spring structures may comprise at least one of a torsion spring, meandering spring, S-shaped spring, U-shaped spring, and a folded spring.
  the rotor protrusions can be dimensioned and arranged to be evenly distributed along the rotor beams and the stator protrusions can be dimensioned and arranged to be evenly distributed along the stator beams.
  The rotor protrusions of a rotor element can have a mutually uniform design and/or the stator protrusions of a stator element can have a mutually uniform design.
  The MEMS devices may include in-plane moving configurations where the rotor moves in a direction parallel to a plane of a support structure, out-of-plane moving configurations where the rotor moves in a direction perpendicular to the plane of the support structure, or both.
  In a right-angled in-plane configuration, where the movement direction is the X-direction
    the first direction can be the X-direction
    the second direction can be the Y-direction
    the end-surfaces of the protrusions can be in the XZ-plane
    the side surfaces of the protrusions can be in the YZ-plane
    the stator and rotor side edges can be in the Z-direction.
  In a right-angled out-of-plane configuration, where the movement direction is the Z-direction
    the first direction can be the Z-direction
    the second direction can be the X-direction
    the end-surfaces of the protrusions can be in the YZ-plane
    the side surfaces of the protrusions can be in the XZ-plane
    the stator and rotor side edges can be in the Y-direction.

The terms X-, Y- and Z-directions are used herein to explain the orientation of different parts of the protrusions in three dimensions in accordance with the principle of the three-dimensional Cartesian coordinates (x, y, z) in an orthogonal coordinate system. Its coordinate surfaces are planes that meet at right angles to one another, i.e., are perpendicular.

The difference to the conventional comb structures is that the capacitor plates are not interleaved. To the contrary, the capacitor plates are arranged so that the second derivative of their capacitance is minimized as a function of the movement of the rotor. This kind of a structure can be combined with traditional tuning structures. Accordingly, as the proposed capacitors can be used to tune resonance frequency up, it is possible to use, for example, traditional parallel plate capping wafer electrode(s) for tuning the resonance frequency down.

The MEMS devices may include in-plane moving configurations, out-of-plane moving configurations, or both configurations.

A voltage applied across the opposed sets of protrusions produces electrostatic force fields in the gap between the opposed protrusions. This phenomenon can be used to drive a resonating structure with alternating voltage (AC voltage). The same structure can be used to tune the resonance frequency by inducing static voltage (DC voltage) across the protrusions that make up the conductor plates.

The proposed technique for tuning, setting, defining, trimming and/or selecting the output frequency of a microelectromechanical (MEMS) resonator overcomes the shortcomings of conventional techniques, and enables resonance frequency shifts toward higher frequencies. In measurements, analytical calculations and simulations, the proposed configuration has increased resonance frequency in a Z-axis element by 3% when using 2.5 V voltage between the overlapping end surfaces of the electrodes, and 12% when using 10 V voltage. A 12% resonance frequency increase means a 25% increase in element fullscale and measuring range.

The invention claimed is:
1. A microelectromechanical structure, comprising:
  a capacitor element including at least one stator element, and at least one rotor element suspended for motion parallel to a first direction in relation to the stator element,
  wherein electrodes of the capacitor element are separated by a distance in a second direction that is perpendicular to the first direction, and a capacitance of the capacitor element is configured to vary according to displacements of the rotor element from an initial position in the first direction,
  wherein the stator element and the rotor element are mutually oriented such that in at least one range of displacements of the rotor element from an initial position in the first direction, a second derivative of the capacitance with respect to the displacement has negative values,
  wherein the stator element includes a stator beam and a plurality of stator protrusions that extend from the stator beam in the second direction, each stator protrusion including
  stator side surfaces on opposite sides of the stator protrusion, each stator side surface extending in the second direction,
  a stator end surface in a distal end of the stator protrusion, wherein the stator end surface extends in the first direction, the rotor element includes a rotor beam and a plurality of rotor protrusions that extend from the rotor beam towards the stator element, each rotor protrusion including rotor side surfaces on opposite sides of the rotor protrusion, each rotor side surface extending in the second direction, a rotor end surface in a distal end of the rotor protrusion, wherein the rotor end surface extends in the first direction, wherein, in initial position, the stator protrusions and the rotor protrusions are configured into protrusion pairs so that the end surfaces of the protrusions of a protrusion pair at least partly overlap by facing each other, and at least one pair of side surfaces of the protrusions of a protrusion pair are aligned to a straight line in the second direction, and wherein each protrusion pair forms a capacitor with a capacitance that is proportional to an overlap between the stator end surface and the rotor end surface of the protrusion pair, and thus arranged to vary according to a motion of the rotor parallel to the first direction.

2. The microelectromechanical structure of claim 1, wherein the stator element and the rotor element are mutually oriented such that a range of displacements of the rotor element, wherein the second derivative of the capacitance with respect to the displacement has negative values, begins immediately after displacement from the initial position.

3. The microelectromechanical structure of claim 1, wherein the stator element and the rotor element are mutually oriented such that a second derivative of the capacitance with respect to the displacement is at a minimum immediately after displacement from the initial position.

4. The microelectromechanical structure of claim 1, wherein in the protrusion pairs, a length of the stator end surface in the first direction, and a length of the rotor end surface in the first direction are equal.

5. The microelectromechanical structure of claim 1, wherein in the protrusion pairs, a length of the stator end surface in the first direction is different from a length of the rotor end surface in the first direction.

6. The microelectromechanical structure of claim 1, wherein in the protrusion pairs, a height of the stator protrusion is equal to a height of the rotor protrusion of the protrusion pair.

7. The microelectromechanical structure of claim 6, wherein the height of the stator protrusions and the rotor protrusions is 1 to 4 times a distance between the facing stator and rotor end surfaces.

8. The microelectromechanical structure of claim 5, wherein a length of the stator or the rotor end surface in the first direction is 1 to 3 times a distance between the facing stator and rotor end surfaces.

9. The microelectromechanical structure of claim 5, wherein a difference between a length of the rotor end surface and the stator end surface in the first direction is 0.5 to 3.5 times a distance between side surfaces of the facing stator and rotor protrusions.

10. The microelectromechanical structure of claim 9, wherein a distance between two adjacent rotor side surfaces or between two adjacent stator side surfaces is 1 to 4 times a distance between the facing stator and rotor end surfaces.

11. The microelectromechanical structure of claim 1, further comprising at least two detection elements, each detection element including one or more capacitor elements, stator elements of which are coupled to a same potential.

12. The microelectromechanical structure of claim 11, wherein one of the at least two detection elements is positioned to detect displacements of the rotor to a positive direction parallel to the first direction, and another one of the at least two detection elements is positioned to detect displacements of the rotor in a negative direction parallel to the first direction, the negative direction being opposite to a positive direction, and wherein each detection element includes one or more capacitor elements, wherein stator elements of each capacitor element included in the detection element are electrically coupled to provide a signal for differential detection.

13. The microelectromechanical structure of claim 12, further comprising at least four detection elements in a cross-coupled configuration.

14. The microelectromechanical structure of claim 1, wherein the microelectromechanical structure has a planar form for alignment with a planar support structure, and wherein the rotor element is suspended to move in an in-plane direction parallel to a plane of the planar form of the microelectromechanical structure.

15. The microelectromechanical structure of claim 1, wherein the microelectromechanical structure has a planar form for alignment with a planar support structure, and wherein the rotor element is suspended to move in an out-of-plane direction perpendicular to a plane of the planar form of the microelectromechanical structure.

16. The microelectromechanical structure of claim 15, wherein the second direction is parallel to the plane of the planar form of the microelectromechanical structure, and wherein the stator beam has a height dimension in the first direction, and the stator protrusions are distributed along the height dimension of the stator beam.

17. A microelectromechanical device including the microelectromechanical structure of claim 1.

18. The microelectromechanical device of claim 17, wherein the microelectromechanical device is an accelerometer or a resonator.

19. The microelectromechanical structure of claim 7, wherein the height of the stator protrusions and the rotor protrusions is 2 to 3 times the distance between the facing stator and rotor end surfaces.

20. The microelectromechanical structure of claim 8, wherein the length of the stator or the rotor end surface in the first direction is 1.5 to 2.5 times a distance between the facing stator and rotor end surfaces.

21. The microelectromechanical structure of claim 9, wherein the difference between the length of the rotor end surface and the stator end surface in the first direction is 1.5 to 2.5 times the distance between side surfaces of the facing stator and rotor protrusions.

22. The microelectromechanical structure of claim 10, wherein the distance between two adjacent rotor side surfaces or between two adjacent stator side surfaces is 2 to 3 times the distance between the facing stator and rotor end surfaces.

* * * * *